(12) United States Patent
Altieri-Weimar et al.

(10) Patent No.: US 11,183,621 B2
(45) Date of Patent: *Nov. 23, 2021

(54) COMPONENT HAVING A BUFFER LAYER AND METHOD FOR PRODUCING A COMPONENT

(71) Applicant: OSRAM OLED GmbH, Regensburg (DE)

(72) Inventors: Paola Altieri-Weimar, Regensburg (DE); Ingo Neudecker, Regensburg (DE); Andreas Ploessl, Regensburg (DE); Marcus Zenger, Hausen/Herrnwahlthann (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/640,062

(22) PCT Filed: Jul. 19, 2018

(86) PCT No.: PCT/EP2018/069655
§ 371 (c)(1),
(2) Date: Feb. 19, 2020

(87) PCT Pub. No.: WO2019/037968
PCT Pub. Date: Feb. 28, 2019

(65) Prior Publication Data
US 2020/0227604 A1 Jul. 16, 2020

(30) Foreign Application Priority Data
Aug. 24, 2017 (DE) ..................... 10 2017 119 346.4

(51) Int. Cl.
*H01L 33/62* (2010.01)
*H01L 23/00* (2006.01)
(Continued)

(52) U.S. Cl.
CPC .............. *H01L 33/62* (2013.01); *H01L 24/33* (2013.01); *H01L 24/83* (2013.01); *H01L 33/36* (2013.01);
(Continued)

(58) Field of Classification Search
CPC combination set(s) only.
See application file for complete search history.

(56) References Cited

U.S. PATENT DOCUMENTS 4,886,709 A 12/1989 Sasame et al.
5,654,586 A * 8/1997 Schwarzbauer .... H01L 23/3735
257/700

(Continued)

FOREIGN PATENT DOCUMENTS

DE 3888880 T2 7/1994
DE 4315272 A1 11/1994
(Continued)

OTHER PUBLICATIONS

International Search Report issued for corresponding PCT application PCT/EP2018/069655, dated Oct. 4, 2018, 16 pages (for informatiuonal purpose only).

(Continued)

*Primary Examiner* — Ratisha Mehta
(74) *Attorney, Agent, or Firm* — Viering, Jentschura & Partner MBB

(57) ABSTRACT

A component may include a semiconductor chip, a buffer layer, a connecting layer, and a metal carrier. The semiconductor chip may include a substrate and a semiconductor body arranged thereon. The metal carrier may have a thermal expansion coefficient at least 1.5 times as great as a thermal expansion coefficient of the substrate or of the semiconductor chip. The chip may be fastened on the metal carrier by the connecting layer, and the buffer layer may
(Continued)

have a yield stress ranging from 10 MPa. The buffer layer may have a thickness ranging from 2 um to 10 um and adjoin the chip. The substrate and the metal carrier may have a higher yield strength than the buffer layer.

19 Claims, 5 Drawing Sheets

(51) Int. Cl.
   *H01L 33/36* (2010.01)
   *H01L 33/38* (2010.01)
   *H01L 33/64* (2010.01)
   *H01L 33/50* (2010.01)

(52) U.S. Cl.
   CPC .......... *H01L 33/382* (2013.01); *H01L 33/647* (2013.01); *H01L 33/505* (2013.01); *H01L 2224/33505* (2013.01); *H01L 2224/83801* (2013.01); *H01L 2933/0066* (2013.01)

(56) References Cited

U.S. PATENT DOCUMENTS

| | | | | |
|---|---|---|---|---|
| 2002/0100545 | A1* | 8/2002 | Gross | H01L 24/83 156/278 |
| 2008/0232420 | A1 | 9/2008 | Brunner et al. | |
| 2009/0190320 | A1* | 7/2009 | Shimizu | H01L 24/73 361/809 |
| 2011/0223747 | A1* | 9/2011 | Scholz | H01L 21/02532 438/482 |
| 2012/0208323 | A1 | 8/2012 | Heinrich et al. | |
| 2013/0044322 | A1* | 2/2013 | Feitisch | H01S 5/068 356/432 |
| 2013/0153020 | A1 | 6/2013 | Hahn et al. | |
| 2017/0345893 | A1* | 11/2017 | Willmeroth | H01L 29/7827 |
| 2017/0352776 | A1* | 12/2017 | Shur | H01L 33/12 |
| 2018/0094799 | A1* | 4/2018 | Shan | H01L 25/0753 |
| 2018/0151548 | A1 | 5/2018 | Pfeuffer et al. | |
| 2019/0131208 | A1* | 5/2019 | Feichtinger | H01L 33/62 |
| 2020/0075529 | A1* | 3/2020 | Otsuka | H01L 24/37 |

FOREIGN PATENT DOCUMENTS

| | | |
|---|---|---|
| DE | 102008046724 A1 | 4/2009 |
| DE | 102011011862 A1 | 8/2012 |
| DE | 102012100429 A1 | 8/2012 |
| DE | 102011056087 A1 | 6/2013 |
| DE | 102015108545 A1 | 12/2016 |
| GB | 2221570 A | 2/1990 |

OTHER PUBLICATIONS

German Search Report issued for corresponding DE application 10 2017 119 346.4, dated Jan. 17, 2018, 9 pages (for informational purpose only).

* cited by examiner

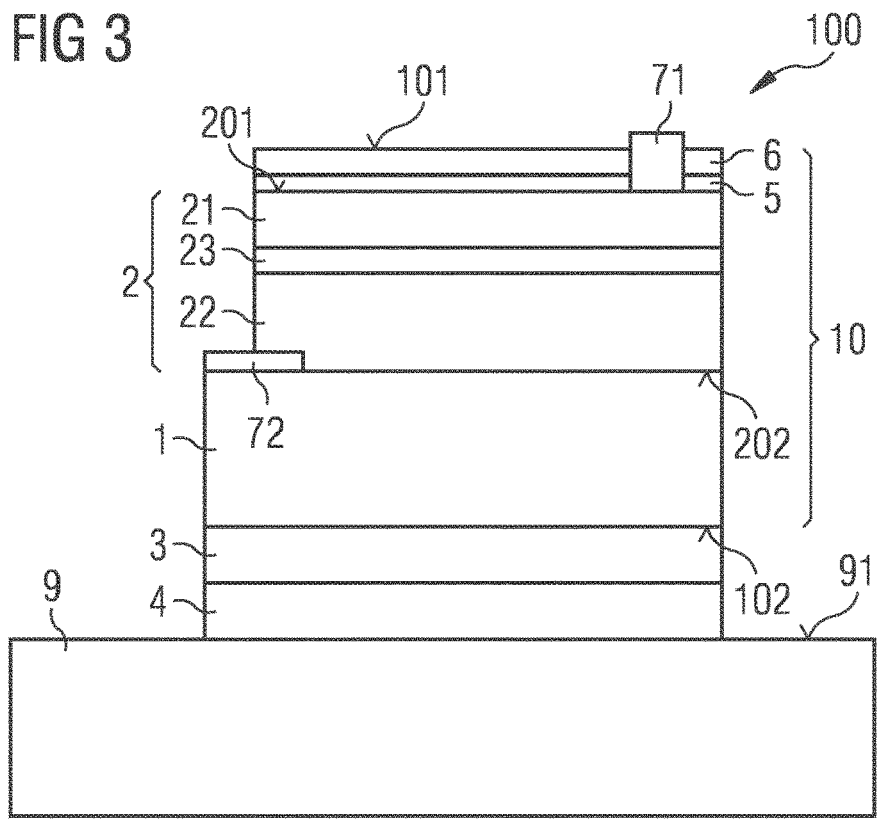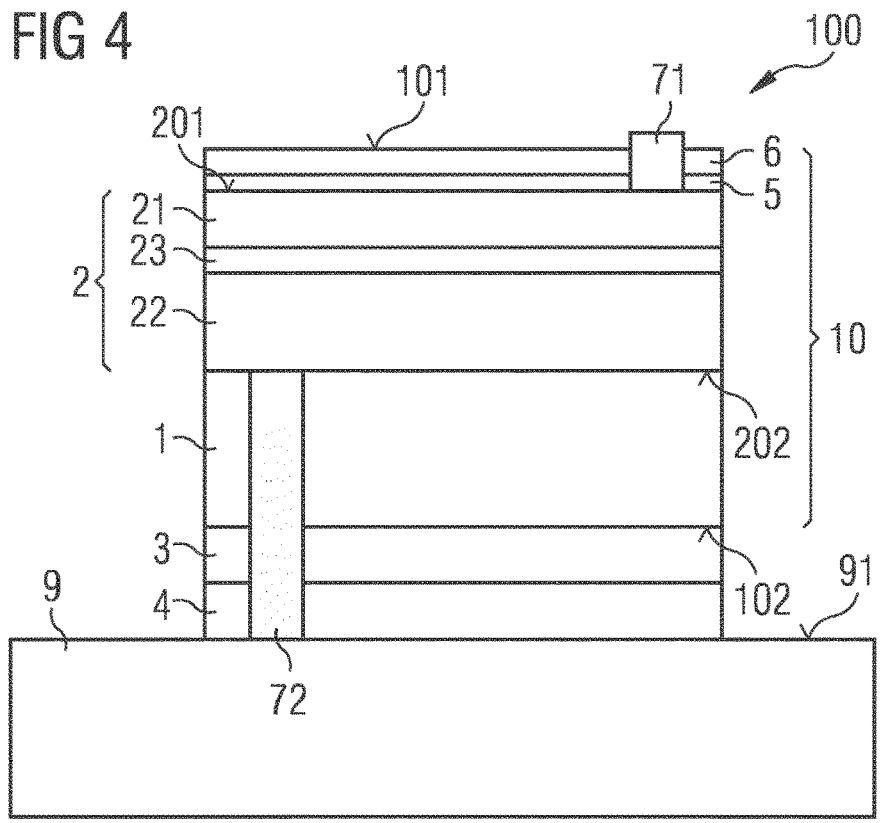

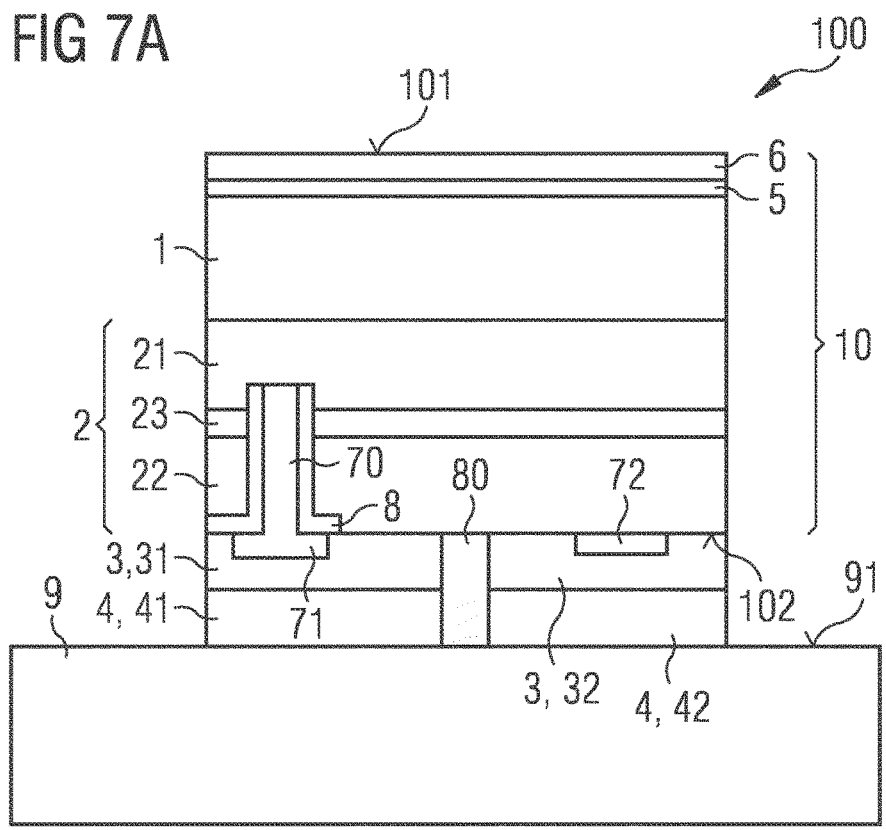
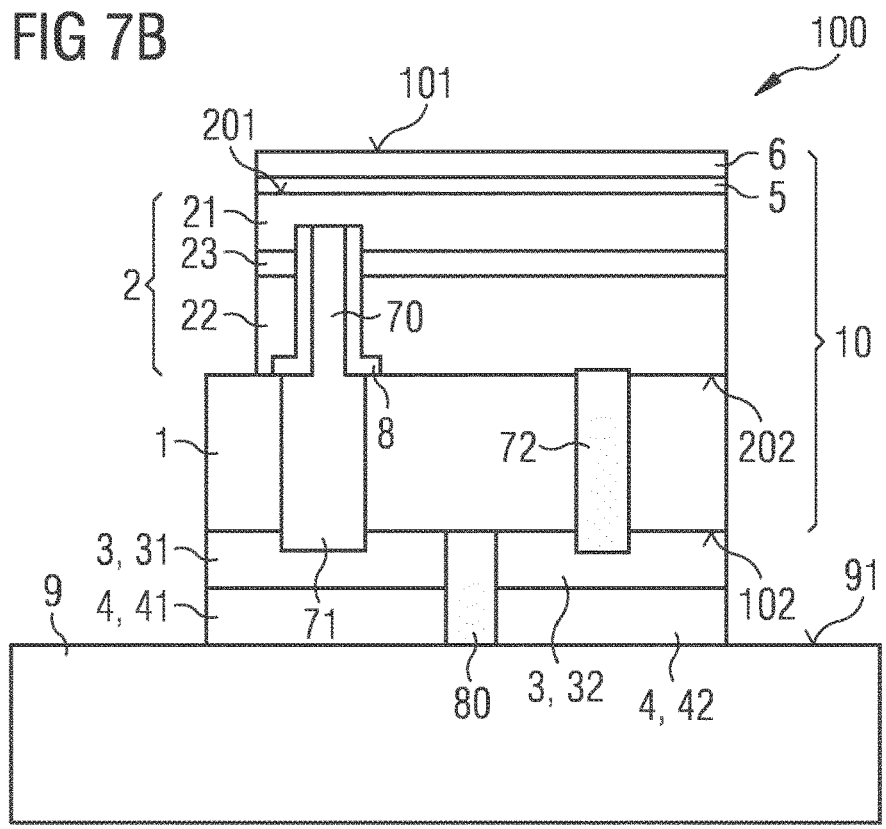

COMPONENT HAVING A BUFFER LAYER AND METHOD FOR PRODUCING A COMPONENT

CROSS-REFERENCE TO RELATED APPLICATIONS

The present application is a national stage entry according to 35 U.S.C. § 371 of PCT application No.: PCT/EP2018/069655 filed on Jul. 19, 2018; which claims priority to Germany application No.: 10 2017 119 346.4, which was filed on Aug. 24, 2017; both of which are incorporated herein by reference in their entirety and for all purposes.

TECHNICAL FIELD

A component, in particular an optoelectronic component with high mechanical stability is provided. A method for producing a component is furthermore provided.

BACKGROUND

In a component including a semiconductor chip, which is fastened on a metal carrier by means of a connecting layer, internal thermomechanical stresses often occur in the event of temperature variations because of different thermal expansion coefficients on the carrier side and on the semiconductor chip side. The internal stresses may lead to damage, in particular to undesired deformations of the component or of the semiconductor chip, in which case the deformations may cause mechanical fractures in the component or pronounced bending and ultimately delamination of the semiconductor chip.

SUMMARY

It is an object to provide a component having increased mechanical stability. It is a further object to provide a simplified and efficient method for producing a mechanically stable component.

According to at least one embodiment of a component, it includes a semiconductor chip. The semiconductor chip may include a substrate and a semiconductor body arranged on the substrate. In particular, the semiconductor body includes a diode structure. For example, the semiconductor body includes an optically active zone, in particular a p-n junction zone. During operation of the semiconductor chip, the optically active zone is adapted, in particular, to emit or detect electromagnetic radiation in the visible, ultraviolet or in the infrared spectral range. For example, the semiconductor chip is a light-emitting diode (LED), for instance a high-power light-emitting diode, or a photodiode.

The substrate may be a growth substrate, on which the semiconductor body is grown epitaxially. It is also possible for the substrate to be different than a growth substrate. The semiconductor chip may be free of a growth substrate. The substrate on which the semiconductor body is arranged may include a base body, which is configured to be electrically insulating. The substrate may be electrically insulating overall.

In particular, the substrate, in particular the base body of the substrate, is formed from a material which is different than a metal. For example, the substrate or the base body of the substrate is based on a semiconductor material, for instance on Si or Ge, or a ceramic material, for instance on SiN or SiC. The substrate may additionally include fillers, for instance consisting of plastics. In particular, the substrate may be formed from a mixture of a ceramic material and/or semiconductor material and a plastic or a plurality of plastics. It is possible for at least 50, 60, 70, 80 or at least 90% of the weight and/or of the volume of the semiconductor chip to be composed of the substrate. As an alternative or in addition, it is possible for the substrate to include a metal through-contact or a plurality of, for instance two, metal through-contacts. In this case, the substrate may include a base body which is formed from a semiconductor material or from an electrically insulating material. The through-contact or the multiplicity of through-contacts may extend through the base body, for instance from a rear side of the substrate to a front side of the substrate.

According to at least one embodiment of the component, it includes a metal carrier. The semiconductor chip with the substrate is arranged on the metal carrier. The metal carrier may include a base body consisting of metal. For example, the metal carrier is a lead frame or a printed circuit board having a metal core, for example a metal-core printed circuit board. A metal carrier is generally intended to mean a carrier whose metal component is at least 50, 60, 70, 80 90 or at least 95% of the total weight and/or of the total volume of the carrier. The component is, in particular, mechanically supported primarily by the metal carrier. The metal carrier is, in particular, different to a general chip carrier that supports the semiconductor body and stabilizes the semiconductor chip. For example, the component may include a multiplicity of semiconductor chips, each of which contains a separate substrate and which are arranged on a common metal carrier.

According to at least one embodiment of the component, it includes a connecting layer between the semiconductor chip and the metal carrier. In a non-limiting embodiment, the connecting layer is a solder layer, in particular an AuSn-based solder layer and/or a solder layer containing indium. By the connecting layer, the semiconductor chip can be fixed on the metal carrier, for example in such a way that the substrate of the semiconductor chip faces toward the metal carrier. In the vertical direction, for instance, the substrate is located between the semiconductor body and the carrier of the component. As an alternative, it is possible for the semiconductor chip to be fixed on the metal carrier in such a way that the semiconductor body is located between the substrate and the carrier.

A vertical direction is generally intended to mean a direction which is directed transversely, in particular perpendicularly, to a main extent surface of the semiconductor body. The vertical direction is, for instance, a growth direction of the semiconductor body. A lateral direction, on the other hand, is intended to mean a direction which extends along, in particular parallel to, the main extent surface of the semiconductor body. The vertical direction and the lateral direction are, in particular, perpendicular to one another.

According to at least one embodiment of the component, the metal carrier has a thermal expansion coefficient which is at least 1.5 times, two times, three times, four times, five times or at least ten times as great as a thermal expansion coefficient of the substrate of the semiconductor chip or of the entire semiconductor chip. In case of doubt, a thermal expansion coefficient of a layer is intended to mean an average thermal expansion coefficient, for example an average longitudinal thermal expansion coefficient, of this layer, which is determined under conditions which are standard in the art.

According to at least one embodiment of the component, it includes a buffer layer. The buffer layer may be arranged between the semiconductor chip and the carrier. In a non-limiting embodiment, the buffer layer is arranged between the semiconductor chip and the connecting layer. In particular, the buffer layer adjoins the semiconductor chip. The buffer layer may adjoin the substrate or a rear side of the semiconductor chip and/or connecting layer. Two neighboring layers adjoin one another in particular when they are in direct contact, or when there is only a single further layer, in particular a connecting layer, or a connecting structure, between them.

In particular, the buffer layer is adapted in respect of its material selection and/or geometry to compensate or reduce internal mechanical stresses in the component, for instance thermomechanical stresses in the connecting layer, in the substrate, in the semiconductor chip and/or in the metal carrier. Expediently, the buffer layer is formed from a ductile material. For example, the buffer layer is a ductile metallic layer or a ductile metal layer, which may contain a metal such as gold, aluminum, copper or the like.

According to at least one embodiment of the component, the buffer layer has a yield strength which is at most 300 MPa. In a non-limiting embodiment, the yield strength of the buffer layer is between 10 MPa and 300 MPa inclusive, for instance between 50 MPa and 300 MPa, 100 MPa and 300 MPa, 150 MPa and 300 MPa, 200 MPa and 300 MPa, or between 10 MPa and 250 MPa inclusive, 10 MPa and 200 MPa, 10 MPa and 150 MPa, 10 MPa and 100 MPa or between 100 MPa and 200 MPa inclusive.

A yield stress of a layer is generally intended to mean the normal stress which is required in order to reach and maintain plastic flow in a uniaxial stress state of the layer in question. The yield stress of a layer may generally also be regarded as an average yield stress of this layer. The yield stress is primarily dependent on the material, on the size of the deformation, the strain rate or deformation rate, and on the deformation temperature. The values of yield stress for known materials, determined under conditions which are standard in the art, may be taken from standard works. In case of doubt, the values of yield stress may be determined for a deformation which is 0.2% greater than the linear elastic deformation and with an overall strain rate of between $10^{-6}$/s and $10^{-2}$/s inclusive or between $10^{-6}$/s and $10^{-4}$/s inclusive, for instance $5*10^{-4}$/s or $10^{-5}$/s, and with deformation temperatures of between −50° C. and 280° C. inclusive, for instance with a deformation temperature of 20° C. or 75° C.

According to at least one embodiment of the component, the buffer layer is configured to be coarse-grained. For example, the buffer layer has an average grain size which is greater than 100 nm, for example between 100 nm and 150 nm inclusive, between 100 nm and 200 nm inclusive, between 100 nm and 300 nm inclusive, or between 100 nm and 1 μm inclusive. The coarse-grained particles of the buffer layer may be metals or metal alloys. In particular, the coarse-grained particles may be embedded in a matrix material, for instance consisting of a plastic. Depending on how coarsely grained the buffer layer is configured, its yield point may be adjusted. The more coarsely grained the buffer layer is, the lower its yield stress.

According to at least one embodiment of a component, it includes a semiconductor chip, a buffer layer, a connecting layer and a metal carrier. The semiconductor chip includes a substrate and a semiconductor body arranged thereon. The metal carrier has a thermal expansion coefficient which is at least 1.5 times as great as a thermal expansion coefficient of the substrate or of the semiconductor chip. The buffer layer may be arranged between the metal carrier and the semiconductor chip. In a non-limiting embodiment, the semiconductor chip is fastened on the metal carrier by means of the connecting layer in such a way that the buffer layer is arranged between the semiconductor chip and the connecting layer. For example, the buffer layer adjoins the semiconductor chip. In particular, the substrate adjoins the buffer layer. Furthermore, the buffer layer has a yield stress which is at least 10 MPa and at most 300 MPa.

Owing to the presence of the buffer layer, internal stresses in the component, which occur because of different thermal expansion coefficients on the carrier side and on the semiconductor chip side in the event of large temperature variations, can be reduced. A deformation of the semiconductor chip and/or of the carrier, for instance in the form of bending, may therefore be minimized in the event of varying working temperatures of the component. The fixing, for instance the soldering, of the semiconductor chip on the carrier in order to form a stable component may also be carried out reliably with the use of the buffer layer, since the internal mechanical stresses which occur after soldering and when cooling the component, can for the most part be absorbed by the buffer layer. The risk in terms of the formation of cracks inside the connecting layer and/or the carrier is also reduced.

According to at least one embodiment of the component, the substrate and/or the carrier have/has a greater vertical layer thickness than the buffer layer. In particular, the vertical layer thickness of the substrate and/or of the carrier is at least three times, five times, ten times, twenty times or at least fifty times as great as the vertical layer thickness of the buffer layer.

For example, the buffer layer has a vertical layer thickness of between 300 nm and 10 μm inclusive, for instance between 1 μm and 10 μm inclusive, 2 μm and 10 μm, 3 μm and 10 μm or between 300 nm and 5 μm inclusive, 300 nm and 3 μm, or between 1 μm and 5 μm inclusive, or between 1 μm and 3 μm inclusive.

The substrate and/or the metal carrier may, on the other hand, have a vertical layer thickness of at least 50 μm, for example between 50 μm and 100 μm inclusive, 50 μm and 150 μm, 50 μm and 200 μm, 50 μm and 300 μm, or between 50 μm and 400 μm inclusive. It is also possible for the substrate and/or the metal carrier to have a vertical layer thickness of more than 400 μm.

The metal carrier may serve as a heat sink for the semiconductor chip. The buffer layer with the relatively small vertical extent therefore has a low thermal resistance, so that the heat generated during operation of the semiconductor chip can be efficiently delivered into the metal carrier through the buffer layer.

According to at least one embodiment of the component, the substrate and/or the metal carrier have/has a greater yield stress than the buffer layer. For example, the difference is at least 30 MPa, 40 MPa, 50 MPa, 60 MPa or at least 100 MPa. With such a configuration of the component, in comparison with the substrate and/or the metal carrier, the onset and continuation of the plastic flow of the buffer layer is achieved earlier, so that fractures inside the component can be avoided, particularly in the region of the substrate. The substrate may in this case be formed from a semiconductor material or from a ceramic material, and therefore be configured to be somewhat more brittle in comparison with the buffer layer and the metal carrier.

According to at least one embodiment of the component, the thermal expansion coefficient of the substrate or of the semiconductor chip is less than 15 ppm/K, for instance less than 8 ppm/K, i.e. less than $8*10^{-6}$ $K^{-1}$, for example between 2 ppm/K and 15 ppm/K inclusive. The thermal expansion coefficient of the carrier may be more than 8 ppm/K, for example between 8 ppm/K and 30 ppm/K inclusive. In particular, the thermal expansion coefficient of the metal carrier differs by at least 3 ppm/K, 5 ppm/K, 7 ppm/K or by at least 10 ppm/K from the thermal expansion coefficient of the substrate or of the semiconductor chip.

According to at least one embodiment of the component, the substrate or a base body of the substrate is formed from a ceramic material, which may be based on SiN or on SiC, or from a semiconductor material such as Si and Ge. Ceramic material has a high thermal conductivity and is particularly suitable as a material for the substrate of a high-power diode. Such a substrate may include plastics and/or metal through-contacts.

According to at least one embodiment of the component, the carrier includes at least one material from the group consisting of Ag, Al, Au, Cu, Mg, Mn, Ni, Pb, Pt, Sn, Mo, W and Zn.

According to at least one embodiment of the component, the buffer layer includes at least one metal or consists of a metal or a metal alloy. In particular, the buffer layer may be formed from a ductile metal such as Au, Al, Cu or from a similar metal. In a non-limiting embodiment, the buffer layer is configured in respect of its material selection and in relation to the carrier and the substrate in such a way that it has a lower yield strength than the carrier and/or the substrate.

According to at least one embodiment of the component, the connecting layer is an AuSn-based solder layer. The connection of the semiconductor chip to the carrier is carried out at a temperature above the melting temperature of the solder used. In the case of AuSn, the melting temperature is 280° C. or higher. During cooling, the size of the component is reduced, although not uniformly in the region of the semiconductor chip and in the region of the carrier. It has been found that the buffer layer consisting of a metal or a metal alloy with a yield stress of between 10 MPa and 300 MPa inclusive, in particular between 100 MPa and 300 MPa inclusive, can compensate for large stresses in the component over a wide temperature interval, for instance between −50° C. and 300° C. inclusive. Possible bending of the semiconductor chip and/or of the carrier or delamination of the semiconductor chip in the event of temperature variation may therefore be avoided.

According to at least one embodiment of the component, it includes a converter layer which contains phosphors, i.e. wavelength-converting luminescent materials. The semiconductor chip is, in particular, a light-emitting diode. The converter layer may be fastened on the semiconductor chip, for instance on a surface of the semiconductor chip facing away from the carrier. For example, the converter layer is arranged on an upper side, facing away from the substrate, of the semiconductor body. If the semiconductor body is arranged between the substrate and the carrier, the converter layer may be arranged on an upper side, facing away from the semiconductor body, of the substrate. In particular, the converter layer is adapted to convert short-wave, in particular blue or ultraviolet, components of the electromagnetic radiation emitted by the semiconductor chip into long-wave, for example yellow, green or red, components of electromagnetic radiation during operation of the component.

The converter layer is a prefabricated converter platelet, which may have a constant vertical layer thickness within the scope of production tolerances. The converter platelet may be configured to be self-supporting and, in particular, planar. By means of a further connecting layer, the converter platelet may be fastened on the semiconductor chip, for instance on the upper side of the semiconductor chip, in particular on the upper side of the semiconductor body. The further connecting layer may be a bonding or adhesive layer, and is in particular different than a solder layer. With the use of the buffer layer, deformation of the semiconductor chip is prevented or at least reduced, so that mechanical stresses, particularly in the adhesive bond of the converter platelet to the semiconductor chip, and therefore also the risk in terms of color locus displacement, are reduced. In other words, color locus variations that are attributable to deformations or bending of the converter layer or of the converter platelet during operation of the component can be avoided or minimized.

By the buffer layer, possible bending or deformations of the component or of the semiconductor chip are prevented or reduced, so that a stable connection between the converter platelet and the semiconductor chip can be ensured. Without the buffer layer, such bending or deformations would occur often, in particular when the substrate and/or the carrier have/has a vertical layer thickness which is less than 400 µm, in particular less than 300 µm or less than 200 µm.

According to at least one embodiment of the component, the buffer layer covers at least 90% of a rear side, facing toward the carrier, of the semiconductor chip, or of the substrate. For example, the buffer layer fully covers the rear side of the semiconductor chip. In a plan view of the carrier, the semiconductor chip may cover the buffer layer fully. In a plan view, the carrier has, for example, a larger surface than the semiconductor chip. The buffer layer is located, in particular, only in the regions below the semiconductor chip, and therefore does not protrude beyond the semiconductor chip on the mounting surface of the carrier. It is possible for the component to include a multiplicity of semiconductor chips on a common metal carrier, a buffer layer in each case being assigned uniquely to one of the semiconductor chips.

According to at least one embodiment of the component, the substrate is arranged between the carrier and the semiconductor body. As an alternative, it is possible for the semiconductor body to be arranged between the carrier and the substrate.

According to at least one embodiment of a method for producing a component, the component is heat-treated after the semiconductor chip or the multiplicity of semiconductor chips have/has been fastened on the carrier. In order to adapt the flow properties of the connecting layer and/or of the buffer layer, the component may be heat-treated at temperatures of between 125° C. and 200° C. inclusive. The heat treatment may be carried out over a duration of a few minutes, for instance between 10 minutes and 50 minutes, or a few hours, for instance between one hour and 10 hours. The connecting layer is, for instance, an AuSn-based solder layer and/or a solder layer containing indium, the melting temperature of which is higher than the temperatures applied during the heat treatment.

By the heat treatment, on the one hand the internal stresses in the component, and on the other hand possible bending of the component, may be reduced. It has been found that the curvature of the component may be additionally reduced by up to 40% by the heat treatment.

The method described above is particularly suitable for the production of a component as described here. The features described in connection with the component may therefore be used for the method, and vice versa.

BRIEF DESCRIPTION OF THE DRAWINGS

Further advantageous embodiments and developments of the component emerge from the exemplary embodiments described below in conjunction with the figures.

FIGS. 2, 3, 4 and 5 show schematic representations of various embodiments of a component having a buffer layer, respectively in a sectional view.

FIGS. 7A and 7B show schematic representations of further embodiments of a component having a buffer layer, respectively in a sectional view.

Elements which are the same or of the same type, or which have the same effect, are provided with the same references in the figures. The figures are respectively schematic representations and therefore not necessarily true to scale. Rather, relatively small elements, and in particular layer thicknesses, may be represented exaggeratedly large for illustration.

DETAILED DESCRIPTION

Figure 1:
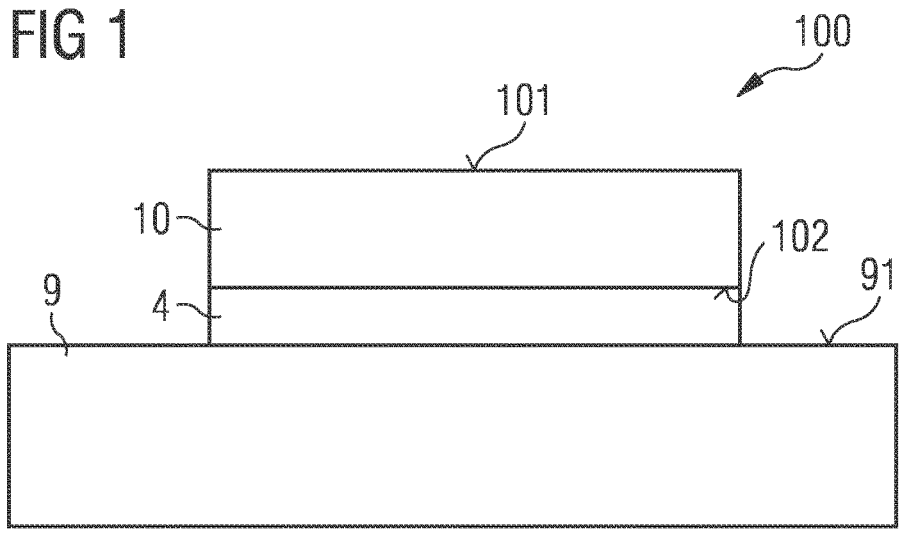
FIG. 1 shows a comparative example of a component without a buffer layer in a schematic sectional view.

FIG. 1 schematically represents a comparative example of a component 100 having a semiconductor chip 10 on a carrier 9, the semiconductor chip 10 being fastened on a mounting surface 91 of the carrier 9 by a connecting layer 4.

The semiconductor chip 10 includes a front side 101 and a rear side 102 facing away from the front side 101. A front side of the component 100 may be formed by the front side 101 of the semiconductor chip 10. For example, the front side 101 is a radiation entry face or a radiation exit face of the semiconductor chip 10 or of the component 100. In particular, the connecting layer 4 adjoins both the mounting surface 91 of the carrier 9 and the rear side 102 of the semiconductor chip 10.

Figure 5:
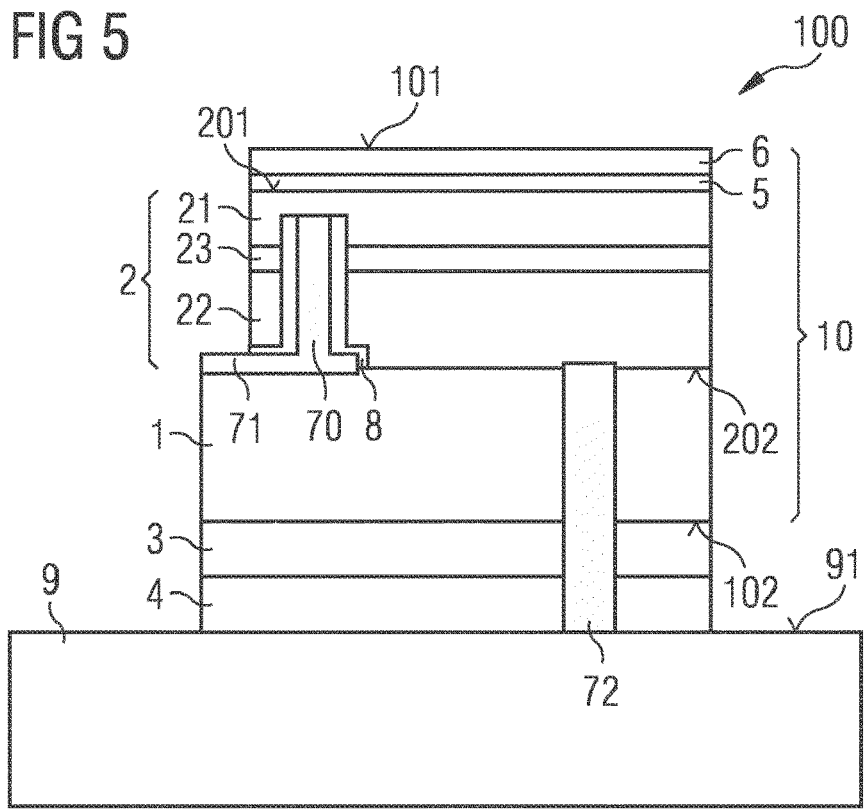

The semiconductor chip 10 having a substrate 1, a semiconductor body 2 and optionally having a converter layer 6 is, for example, schematically represented in FIGS. 3 to 5.

In general, the carrier 9 and the semiconductor chip 10, in particular the carrier 9 and the substrate 1 of the semiconductor chip 10, have different thermal expansion coefficients. In the event of large temperature variations, internal stresses may be formed in the component 100, which lead to bending of the component 100, in particular of the semiconductor chip 10, or to fracture of the component 100, for instance at the connecting layer 4. Bending of the semiconductor chip 10, which in particular is an LED having a converter layer 6, may furthermore lead to undesired color locus changes in the event of temperature variations. The converter layer 6, which is configured for instance in the form of a converter platelet and is fastened on the semiconductor chip 10 by means of a further connecting layer 5, may be detached from the semiconductor chip 10 because of possible deformation of the component 100.

In order to avoid possible fractures in the connecting layer 4 or in the semiconductor chip 10 because of different thermal expansion coefficients between the substrate 1, which is formed for instance from Si, Ge, SiN or SiC, and the carrier 9, which in particular is formed from a metal such as Cu, a sufficient breaking strength of the component 100 should be ensured. This may, for example, be done by using a solder connection having a high mechanical strength between the semiconductor chip 10 and the carrier 9. In order to prevent large color locus changes of the semiconductor chip 10 or detachment of the converter layer 6, an adhesive that adheres particularly well should be used for the adhesive bonding of the converter layer 6, and a minimum thickness should additionally be ensured for the further connecting layer 5. Despite the measures mentioned above, however, there may be a non-negligible quality risk due to the high stresses in a component 100 having a semiconductor chip 10 on a metal carrier 9.

In order to minimize such quality risks, the component 100 may be configured in such a way that a buffer layer 3 is formed between the semiconductor chip 10 and the metal carrier 9. According to FIG. 2, the component 100 includes such a buffer layer 3. The buffer layer 3 is arranged between the semiconductor chip 10 and the connecting layer 4 in the vertical direction. In particular, the buffer layer 3 adjoins both the connecting layer 4 and the semiconductor chip 10, in particular the substrate 1 of the semiconductor chip 10. In a non-limiting embodiment, only the buffer layer 3 and the connecting layer 4 are arranged between the mounting surface 91 of the carrier 9 and the rear side 102 of the semiconductor chip 10.

It is possible for the buffer layer 3 to be configured as part of the semiconductor chip 10. In this case, the semiconductor chip 10 already includes the buffer layer 3 before the semiconductor chip 10 is applied on the carrier 9. The buffer layer 3 may be formed directly or indirectly on the semiconductor chip 10, in particular on a rear side 102 of the semiconductor chip 10, for example on the substrate 1 of the semiconductor chip 10. To this end, a starter layer may initially be formed on the rear side 102, in particular on the substrate 1, after which the buffer layer 3 is formed on the starter layer, for instance by means of an electroplating method. As an alternative, it is possible for the buffer layer 3 to be formed by another coating method, for example by an evaporation or deposition method such as vapor deposition, or by sputtering. In this case, a starter layer may be omitted.

In a plan view, the buffer layer 3 may be fully covered by the substrate 1 and/or by the semiconductor body 2. The buffer layer 3 may cover at least 60%, 70%, 90% or at least 95% of a surface area of the rear side 102 of the semiconductor chip 10. In at least one lateral direction or in all lateral directions, the buffer layer 3 may be flush with the substrate 1 or with the semiconductor chip 10.

The buffer layer 3 has a material composition which is necessarily different to a material composition of the carrier 9 and/or of the substrate 1. In a non-limiting embodiment, the buffer layer 3 is configured to be metallic and has a yield stress of between 10 MPa and 300 MPa inclusive. Expediently, the buffer layer 3 includes a ductile metal such as Au, Al or Cu or alloys thereof, or consists of one or more of these materials. In order to reduce the yield stress, the buffer layer 3 may be configured to be coarse-grained, for instance with metal grains larger than 100 nm.

Figure 2:
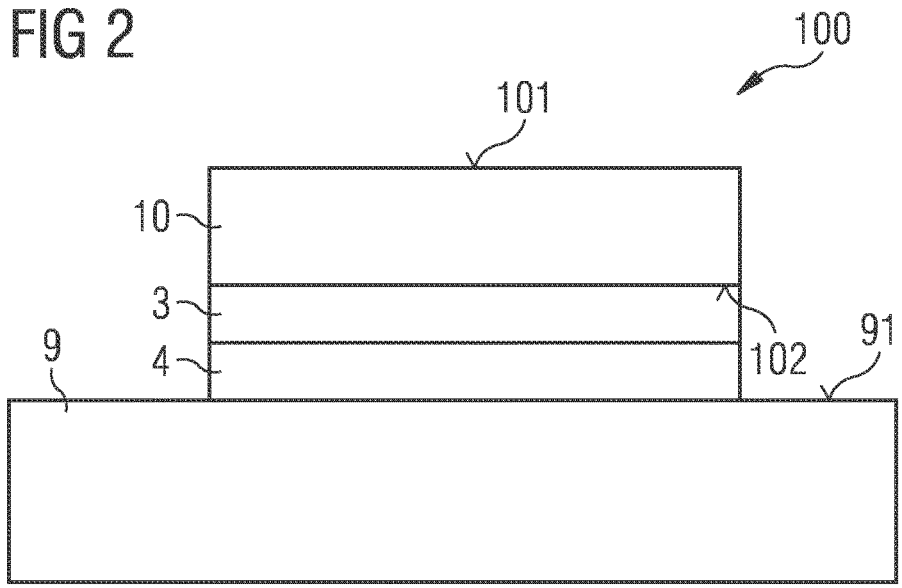

The embodiment represented in FIG. 3 corresponds substantially to the embodiment of a component 100 as represented in FIG. 2. In contrast thereto, the semiconductor chip 10 in FIG. 3 is represented in somewhat more detail.

The semiconductor body 2 includes a first semiconductor layer 21 facing away from the substrate 1, a second semiconductor layer 22 facing toward the substrate 1, and an optically active zone 23 arranged between the first and second semiconductor layers. The semiconductor body 2 is based, in particular, on an III-V or II-VI compound semiconductor material. The first semiconductor layer 21 and the second semiconductor layer 22 may be configured to be n- and p-conductive, respectively, and/or may be n- and p-doped, respectively, or vice versa.

The semiconductor body 2 includes a first main surface 201 facing away from the substrate 1 and a second main surface 202 facing toward the substrate 1. The first main surface 201 and the second main surface 202 respectively delimit the semiconductor body 2 in a vertical direction. The converter layer 6 is fastened on the first main surface 201 of the semiconductor body 2 by the further connecting layer 5. A surface, in particular an exposed surface, of the converter layer 6 forms the front side 101 of the semiconductor chip 10 and/or of the component 100.

The semiconductor chip 10 includes a first contact layer 71 for electrical contacting of the first semiconductor layer 21, and a second contact layer 72 for electrical contacting of the second semiconductor layer 22. In FIG. 3, the first contact layer 71 is arranged on the side of the first main surface 201, and the second contact layer 72 is arranged on the side of the second main surface 202 of the semiconductor body 2. In particular, the second contact layer is arranged between the semiconductor body 2 and the substrate 1 in regions. By means of the contact layers 71 and 72, which are at least partially accessible via the front side 101 of the component 100, the semiconductor chip 10 may be externally electrically contacted.

The carrier 9 may include conductive tracks (not represented in the figures), which are for instance arranged on the mounting surface 91. For example, the contact layers 71 and 72 may be electrically conductively connected to the conductive tracks of the carrier 9 by means of bond wires. It is possible for the carrier 9 to include metal lead frames, around which a molded body is for instance molded. The molded body may be configured to be electrically insulating.

The embodiment represented in FIG. 4 corresponds substantially to the embodiment of a component 100 as represented in FIG. 3. In contrast thereto, the second contact layer 72, which is configured in the form of a through-contact, extends for instance from the second main surface 202 through the substrate 1. The second contact layer 72 may include subregions which extend through the buffer layer 3 and the connecting layer 4 to the carrier 9. It is possible for the second contact layer 72 to extend only as far as the rear side 102 of the semiconductor chip 10, in particular when the buffer layer 3 and the connecting layer 4 are configured to be electrically conductive. The semiconductor chip 10 may be in electrical contact with the carrier 1, and is electrically contactable via the carrier 1.

In contrast to FIG. 4, it is possible for the substrate 1 to be configured to be electrically conductive. In this case, the second contact layer 72 configured as a through-contact may be omitted.

The embodiment represented in FIG. 5 corresponds substantially to the embodiment of a component 100 as represented in FIG. 4. In contrast thereto, the semiconductor chip 10 includes a through-contact 70, which extends for instance from the second main surface 202 through the second semiconductor layer 22 and the active zone 23 into the first semiconductor layer 21. For lateral electrical insulation, the through-contact 70 is for instance fully enclosed in lateral directions by an insulation layer 8.

According to FIG. 5, both the first contact layer 71 and the second contact layer 72 are located on the second main surface 202 in regions. The first contact layer 71 is arranged between the substrate 1 and the semiconductor body 2 at least in places. In contrast to FIG. 5, it is possible for both the first contact layer 71 and second contact layer 72 to extend through the substrate 1. In such cases, the semiconductor chip 10 is a surface-mountable semiconductor chip, which is electrically contactable only on its rear side 102.

FIGS. 6A, 6B, 6C and 6D graphically represent results of some experimental measurements (FIG. 6A) and some simulations (FIGS. 6B, 6C and 6D) for a component 100. The references K, N and S respectively stand for curvature of the semiconductor chip 10, the maximum normal stress determined on the semiconductor chip 10, and the maximum shear stress determined on the semiconductor chip, at room temperature after the connecting process. The parameters O3, M3, T1 and T2 respectively denote, in the order specified, "without buffer layer 3, "with buffer layer 3", "before the heat treatment, and "after the heat treatment".

A component 100 including a semiconductor chip 10 and a carrier 9 is used as the specimen, the carrier 9 having lead frames made of copper, and the semiconductor chip 10 including a silicon substrate 1 and being fastened on the carrier 9 by means of a solder layer 4. The carrier 9 has a layer thickness of about 150 µm. The buffer layer 3 is formed from gold and has a layer thickness of about 2 µm.

Figure 6A:
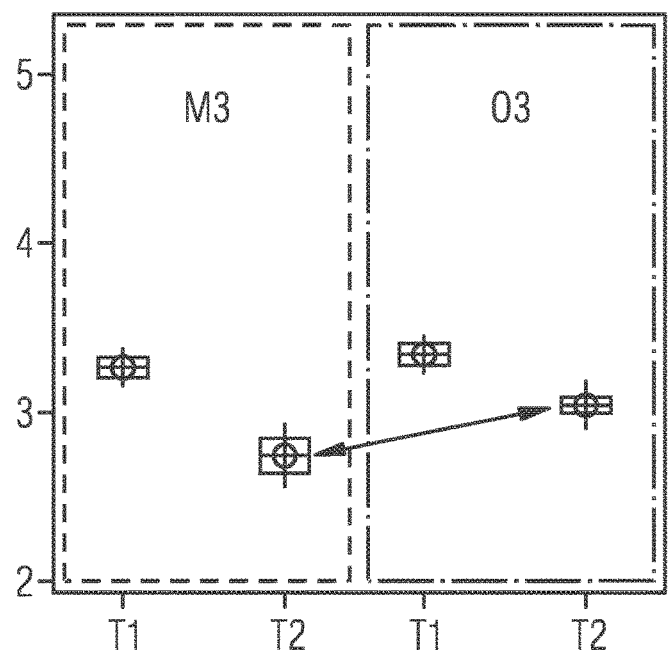
FIGS. 6A, 6B, 6C and 6D show schematic representations of results of some experimental measurements and simulations of various components before and after a heat treatment.
Figure 6B:
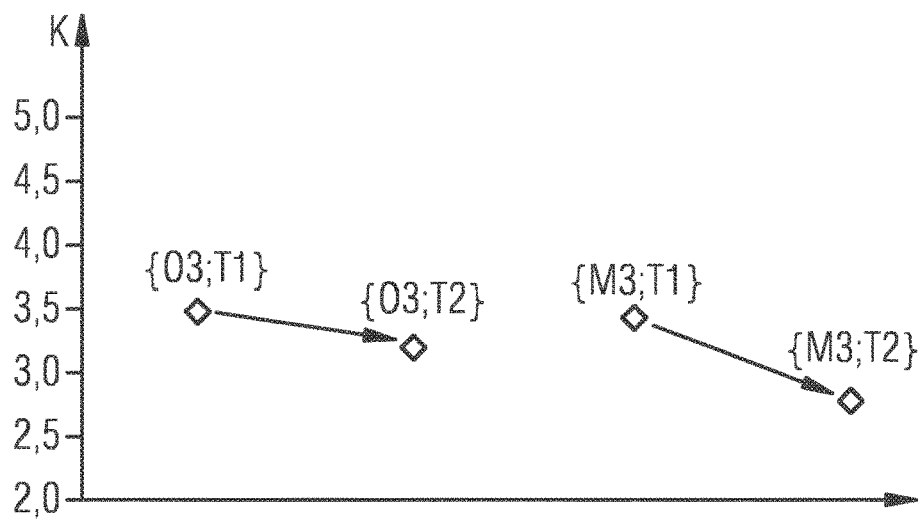

It may be seen from FIG. 6A that the curvature K is reduced when the buffer layer 3 is used. The curvature K of the semiconductor chip 10 and/or of the component 100 may also be reduced by a heat-treatment process, the curvature K being reduced significantly more greatly when the buffer layer 3 is present. This effect in relation to the reduction of the curvature K may likewise be seen from FIG. 6B. According to the results represented in FIGS. 6A and 6B, the semiconductor chip 10 has the smallest curvature K when the component 100 includes a buffer layer 3 and the component 100 is thermally treated, in particular after the semiconductor chip 10 is fastened on the carrier 9.

Figure 6C:
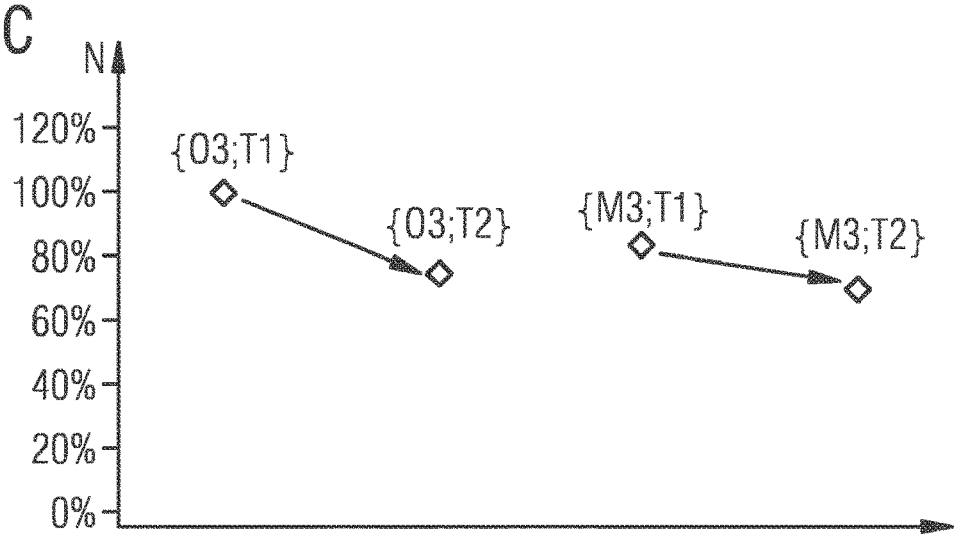
Figure 6D:
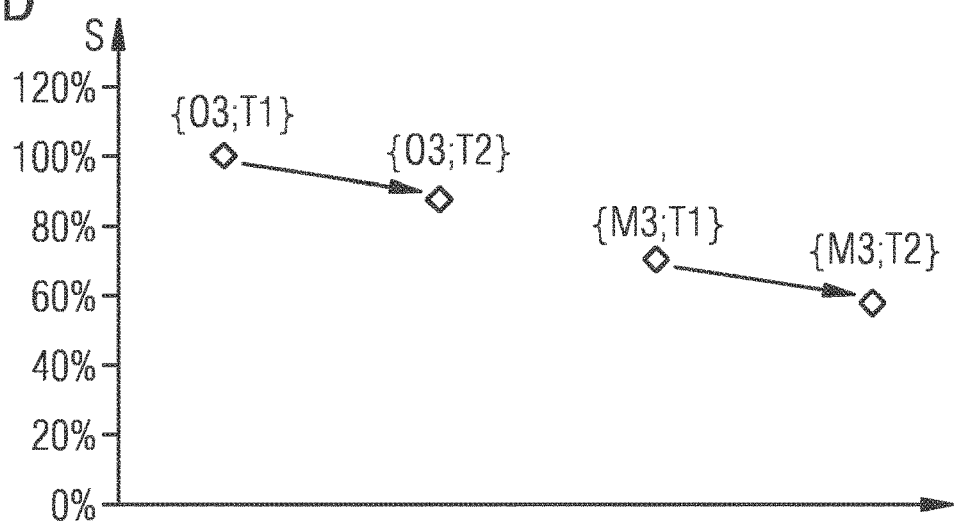

In comparison with the curvature K, similar results are represented in FIGS. 6C and 6D for the normalized normal stress N and the shear stress S. In this case, the maximum normal stress N and the maximum shear stress S are normalized to 1 for a component without the buffer layer 3 at the time T1. It has been found that the component 100 is most stable when the component 100 includes a buffer layer 3 and is thermally treated. In this case, the maximum normal stress N or the maximum shear stress S may be reduced by more than 20% or by more than 40%.

It is furthermore found that the maximum normal stress N decreases with an increasing layer thickness of the buffer layer 3. At layer thicknesses of 0.5 µm, 1 µm and 2 µm, in the order specified, a maximum normal stress of 127 MPa, 125 MPa and 124 MPa is determined.

The embodiment represented in FIG. 7A corresponds substantially to the embodiment of a component 100 as represented in FIG. 5. In contrast thereto, the semiconductor body 2 is arranged between the substrate 1 and the carrier 9 or the buffer layer 3. The substrate 1 is located between the semiconductor body 2 and the converter layer 6. In particular, the semiconductor chip 10 is a flip-chip. The substrate 1 may be configured to be transparent for radiation.

In another difference from the component 100 represented in FIG. 5, the buffer layer 3 and/or the connecting layer 4 include/includes subregions which are laterally separated by an intermediate region 80. The intermediate region 80 may be filled with an electrically insulating material. A first subregion 31 of the buffer layer 3 is, for instance, electrically connected to the first contact layer 71. A second subregion 32 of the buffer layer 3 is, for instance, electrically connected to the second contact layer 72. A first subregion 41 of the connecting layer 4 is laterally separated from the second subregion 42 of the connecting layer 4, and in particular electrically insulated therefrom, by the intermediate region 80. The intermediate region 80 extends along the vertical direction, in particular through the buffer layer 3 and/or through the connecting layer 4.

Via the first subregions 31 and 41, the first contact layer 71 may, for instance, be electrically contacted with a first connection pad and or with a first conductive track on the carrier 9 (not represented in FIG. 7A). Via the second subregions 32 and 42, the second contact layer 72 may, for instance, be electrically contacted with a second connection pad and or with a second conductive track on the carrier 9 (not represented in FIG. 7A).

In contrast to FIG. 7A, it is possible for the contact layers 71 and 72 to extend through the buffer layer 3 and, for instance, to be electrically insulated from the buffer layer 3 by an insulation layer. In this case, the buffer layer 3 may furthermore be configured to be continuous. It is also possible for the intermediate region 80 to extend through the carrier 9 and to separate the carrier 9 into two subregions laterally separated from one another.

The embodiment represented in FIG. 7B corresponds substantially to the embodiment of a component 100 as represented in FIG. 5. In contrast thereto, both the first contact layer 71 and the second contact layer 72 are formed as through-contacts through the substrate 1. The electrical contacting represented in FIG. 7B between the semiconductor chip 10 and the carrier 9 corresponds to the contacting represented in FIG. 7A.

By a buffer layer, in particular consisting of a ductile material, which is arranged between a metal carrier and a semiconductor chip fastened on the carrier, a component including the carrier and the semiconductor chip may be rendered particularly mechanically stable. Such a component is furthermore particularly insensitive to large temperature variations in terms of its mechanical stability and/or color locus stability.

The description with the aid of the embodiments does not restrict the invention to these embodiments; rather, the invention includes any new feature and any combination of features. This includes in particular any combination of features in the patent claims, even if this feature or this combination per se is not specifically indicated in the patent claims or embodiments.

LIST OF REFERENCES

100 component
10 semiconductor chip
101 front side of the semiconductor chip/of the component
102 rear side of the semiconductor chip
1 substrate of the semiconductor chip
2 semiconductor body
21 first semiconductor layer
22 second semiconductor layer
23 optically active zone
201 upper side of the semiconductor body
202 lower side of the semiconductor body
3 buffer layer
31 first subregion of the buffer layer
32 second subregion of the buffer layer
4 connecting layer
41 first subregion of the connecting layer
42 second subregion of the connecting layer
5 further connecting layer
6 converter layer
71 first contact layer
72 second contact layer
70 through-contact
8 insulation layer
80 intermediate region
9 carrier of the component
91 mounting surface of the component
K curvature
N normal stress
S shear stress
O3 without buffer layer 3
M3 with buffer layer 3
T1 before the heat treatment
T2 after the heat treatment

The invention claimed is:

1. A component:
a semiconductor chip;
a buffer layer;
a connecting layer; and
a metal carrier;
wherein:
the semiconductor chip comprises a substrate and a semiconductor body arranged thereon,
the metal carrier has a thermal expansion coefficient at least 1.5 times as great as a thermal expansion coefficient of the substrate or of the semiconductor chip,
the semiconductor chip is fastened on the metal carrier by the connecting layer in such a way that the buffer layer is arranged between the semiconductor chip and the connecting layer and adjoins the semiconductor chip,
the buffer layer has a yield stress ranging from at least 10 MPa to 300 MPa,
the buffer layer has a vertical layer thickness ranging from 2 μm to 10 μm inclusive,
the buffer layer adjoins the semiconductor chip and is thus configured as part of the semiconductor chip, and
the substrate and the metal carrier respectively have a higher yield strength than the buffer layer.

2. The component as claimed in claim 1, wherein the substrate has a greater vertical layer thickness and a higher yield strength than the buffer layer.

3. The component as claimed in claim 1, wherein the substrate or the metal carrier has a higher yield strength of at least 60 MPa than the buffer layer, so that the onset and continuation of a plastic flow of the buffer layer is achieved earlier in comparison with the substrate or the metal carrier, and fractures inside the component are thereby avoided.

4. The component as claimed in claim 1, wherein:
the thermal expansion coefficient of the substrate ranges from 2 ppm/K to 15 ppm/K inclusive, and
the thermal expansion coefficient of the carrier ranges from 8 ppm/K to 30 ppm/K inclusive.

5. The component as claimed in claim 1, wherein the substrate comprises a base body formed from a ceramic material or from a semiconductor material.

6. The component as claimed in claim 1, wherein:
the carrier comprises at least one material selected from the group consisting of Ag, Al, Au, Cu, Mg, Mn, Ni, Pb, Pt, Sn, Mo, W, Zn, and combinations thereof; and
the buffer layer comprises at least one metal, the buffer layer being configured in respect to its material selection and in relation to the carrier and the substrate in such a way that it has a lower yield strength than the carrier and the substrate.

7. The component as claimed in claim 1, wherein the buffer layer is configured to be coarse-grained with an average grain size of more than 100 nm.

8. The component as claimed in claim 1, wherein the substrate and the metal carrier each have a vertical layer thickness of at least 50 μm.

9. The component as claimed in claim 1, wherein the connecting layer is a solder layer.

10. The component as claimed in claim 1, further comprising a converter layer arranged on a surface, facing away from the carrier, of the semiconductor chip, the semiconductor chip being a light-emitting diode and the converter layer comprising wavelength converting luminescent materials.

11. The component as claimed in claim 10, wherein the substrate and/or the carrier have/has a vertical layer thickness of less than 400 µm, and the converter layer is a prefabricated converter platelet fastened to the semiconductor chip by means of a further connecting layer.

12. The component as claimed in claim 1, wherein the buffer layer covers at least 90% of a rear side, facing toward the carrier, of the semiconductor chip.

13. The component as claimed in claim 1, wherein the semiconductor chip fully covers the buffer layer in a plan view of the carrier.

14. The component as claimed in claim 1, wherein the substrate is arranged between the carrier and the semiconductor body.

15. The component as claimed in claim 1, wherein the semiconductor body is arranged between the carrier and the substrate.

16. A method for producing the component as claimed in claim 1, wherein the method comprises:
fastening the semiconductor chip to the carrier; and
heat-treating the component.

17. The method as claimed in claim 16, wherein the connecting layer is an AuSn-based solder layer, and the component is heat-treated at temperatures ranging from 125° C. to 200° C. inclusive in order to adapt the flow properties of the connecting layer and of the buffer layer.

18. The component as claimed in claim 1, wherein the buffer layer comprises a plurality of coarse grained particles having an average grain size ranging from 100 nm to 1 µm.

19. The component as claimed in claim 1, wherein the buffer layer comprises a plurality of coarse grained particles having a material selected from the group comprising metal, metal alloys, or combinations thereof; wherein the plurality of coarse grained particles are embedded in a plastic matrix material.

* * * * *